United States Patent [19]

Ames

[11] 4,389,533
[45] Jun. 21, 1983

[54] PHOTOVOLTAIC DEVICE FOR PRODUCING ELECTRICAL AND HEAT ENERGY

[76] Inventor: Douglas A. Ames, 1301 20th St., NW., Washington, D.C. 20036

[21] Appl. No.: 242,101

[22] Filed: Mar. 9, 1981

[51] Int. Cl.³ .......................................... H01L 31/04
[52] U.S. Cl. ..................................... 136/248; 136/246; 136/251; 126/436
[58] Field of Search ................. 136/246, 248; 126/436

[56] References Cited

U.S. PATENT DOCUMENTS 4,056,405 11/1977 Varadi .................................. 136/246
4,149,903 4/1979 Lindmayer ........................... 136/248

OTHER PUBLICATIONS

J. W. Stultz, "Thermal & Other Tests of Photovoltaic Modules Performed In Natural Sunlight", DOE/JPL-1012-78/9, (1978), pp. 5-9 to 5-12, 6-2 to 6-3.
A. B. Meinel et al., "Applied Solar Energy", Addison-Wesley Pub. Co., 1976, pp. 470-471.

*Primary Examiner*—Aaron Weisstuch
*Attorney, Agent, or Firm*—Walter D. Ames

[57] ABSTRACT

A photovoltaic device including a solar panel and a container housing phase change materials positioned together so that heat generated during operation of the cells in the panel will melt the phase change materials, thereby storing heat and lowering the operating temperature of the cells.

9 Claims, 3 Drawing Figures

PHOTOVOLTAIC DEVICE FOR PRODUCING ELECTRICAL AND HEAT ENERGY

The present invention relates generally to photovoltaic devices, which include so-called solar cells and housings for those cells. More particularly, it relates to solar panels that hold photovoltaic cells in position to receive light energy, and protect those cells from rough handling and possible destructive ambient conditions.

The art of manufacturing and using solar panels has become well established. Thus, in patents such as U.S. Pat. No. Re. 30,292, issued June 3, 1980, solar panels are disclosed in which photovoltaic cells are encapsulated in a resin, most preferably a silicone resin, which will protect them from rain, dirt and like unfavorable conditions, but will maintain the cells within the panel so that the cells are in a position to receive and absorb impinging light. Cushioned by the resin, the cells are held so that contacts on their front and back surfaces alternate from cell to cell, thereby forming a plurality of cells interconnected in series or parallel arrangement. The panels can be arranged to form a solar array, whereby the energy produced by a multiplicity of cells can be utilized to perform significant work. Particularly desirable arrangements of such solar panels are known, as are materials from which the panels are formed. Panels of advanced design permit the cells to be maintained within the panel in a position in which they are protected not only from ambient weather conditions, but also from mechanical shocks, and whereby the cells will nevertheless perform with a high degree of efficiency and reliability.

It has been recognized that, since photovoltaic cells perform less efficiently at higher temperatures, it would be advantageous to mount those cells in such a way as to dissipate the heat generated on exposure of photovoltaic cells to high-intensity light or possibly put that heat to some effective use. Thus, in U.S. Pat. No. 4,056,405, issued Nov. 1, 1977, a panel for solar cells is disclosed in which the heat generated by the inpingment of light on the cells is dissipated from the immediate environment of the cells. A transfer of heat away from the cells is effected by supporting the cells by a heat-conductive cushion, e.g., an epoxy resin having aluminum powder distributed throughout its volume. In operation, the heat generated by the photovoltaic reaction and by exposure to light passes through the cushion to a wall of the panel, which also forms one side of a conduit through which water or air can be forced to remove the heat as it passes to that wall through the heat conductive cushion. As shown in U.S. Pat. No. 4,056,405, a fluid is introduced into the conduit, one wall of which may be common to the solar panel, and the result is heated air or water.

It has become apparent to me that there are several practical and economic difficulties involved with a structure such as that disclosed in U.S. Pat. No. 4,056,405. In order to effect continual removal of heat from the vicinity of the photovoltaic cells, the passage of fluid through the conduit must be maintained regardless of whether the heated water or heated air has an immediate use. For example, if a solar panel that is cooled by a continuous stream of fluid is to be kept cool during the hottest part of the day, when otherwise its efficiency will be lowest, what will be generated is a stream of heated fluid during that hottest part of the day, when it is least likely that the heated fluid will find immediate use, for example, in heating a home. Thus, often the heated fluid will simply be permitted to dissipate its heat without actual utilization thereof.

It is, therefore, a prime object of my invention to provide in a single article a device that will embody the features of a solar panel, yet will also provide means for acquiring and storing the heat generated by the photovoltaic reaction so that such heat may be used, independent of other storage means, when such heat is desired. Thus, through the use of my device, it will be practical to provide a solar panel for generating electrical energy, which panel will include heat storage means that will simultaneously remove heat from the immediate vicinity of the photovoltaic cells, thereby increasing their efficiency during high-temperature ambient conditions, and store such heat energy for subsequent use during low-temperature conditions. In this manner it will be possible to improve the electricity generating efficiency of photovoltaic cells during their use at high-temperature times of the day, and then not only use the electrical energy at other times but also the heat energy that has been stored within the device.

The essence of my invention is the close association, so that there is a unitary device, of a container for phase change materials conjoined with a solar panel containing the photovoltaic cells. Such phase change materials are known for their heat storage capabilities. Yet, from my examination of the art, there has not been any device which, in a unitary or even portable entity, reveals the association of phase change materials and a photovoltaic panel in such manner that the phase change materials will effectively store heat during daylight hours, such heat then being capable of release and utilization during nondaylight hours when such heat is most needed, rather than being forced to immediate utilization or dissipation.

In accordance with the present invention, there is provided a photovoltaic device for transforming light energy into usable electrical energy and heat energy. That device includes a solar panel having a bottom and side walls that form a tray with an open front to receive light therethrough. Photovoltaic cells are positioned in the tray beneath the open tray front. The cells have light-receiving, upwardly facing surfaces and electrical contacts for collecting and channeling electrical energy generated by those cells to perform work. The bottom of the tray is formed from a material that allows heat to pass through it so that heat generated during operation of the cells passes from the cells to and through the tray bottom.

As part of the photovoltaic device, there is provided a container housing phase change materials that are solid at ambient temperatures of use of the solar panel and can be melted by the heat generated during use of the photovoltaic cells. The container for phase change materials is located outside the tray and in close proximity to the bottom of the tray, so that heat generated at the photovoltaic cells will pass to and through the tray bottom and melt the phase change material in its container. On melting, heat will be effectively stored in the phase change materials for further use, while lowering the operating temperature of the photovoltaic cells.

More narrowly defined, the phase change container that is part of my combined device is a separate container that has means cooperating with the solar panel to enable the container easily to be applied to and removed from the panel. Simple clips can accomplish this purpose. Also, the bottom of the tray from which the solar panel is formed may be made of a heat conductive material and, if desired, the side walls of that tray can be made of material that is not highly heat conductive when compared to the tray bottom.

With respect to the container for the phase change materials, it may also be in the form of a tray and as such, have an open top positioned closely adjacent to the panel tray bottom so that heat passing through the bottom of the solar panel will directly contact the phase change material in its container without the interposition of another wall. Alternatively, the phase change material container may have a top wall which, in operable position, is located in direct contact with the bottom of the panel.

As a further means for utilizing the heat stored in the phase change material, the container for the phase change material may have a bottom formed from a heat conductive material. In this instance the device can also include means for distributing heat from the bottom of the phase change material container to locations remote therefrom. In aid of that function, a duct may be formed, one portion of which is the bottom of the container for the phase change material. Then an impeller can pass a fluid through the duct to carry the heat from the bottom of the phase change material container to a remote location where it is desired to use such heat.

These and other objects, features, and advantages of my invention will be more clearly apparent when considered in connection with the preferred embodiment of my invention described hereinafter and illustrated in the accompanying drawing, in which.

Figure 1:
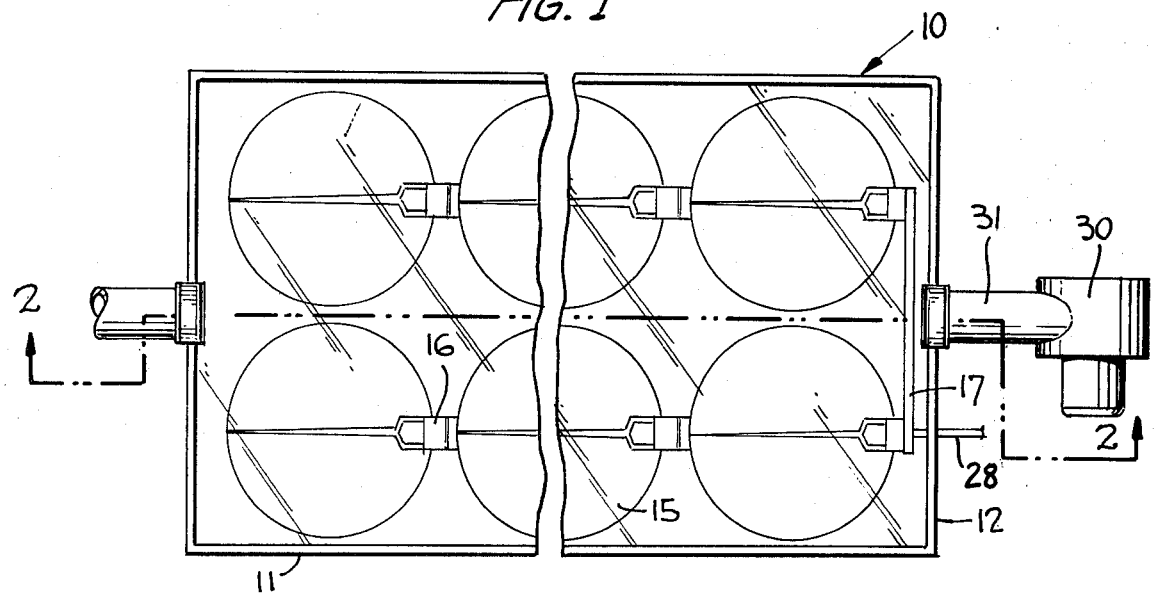
FIG. 1 is a top plan view, partly broken away, of a preferred embodiment of my device.

Referring now to the drawing, and more particularly to FIG. 1 therefore, shown therein is a solar panel indicated generally by reference numeral 10. As will also be seen in other views of what I presently contemplate to be my best mode, the solar panel 10 has side walls 11, end walls 12 and a bottom 13, while the top of the panel is open to the passage of light therethrough. A convenient embodiment is one in which a glass 14 is positioned across the open front of the tray so formed, to furnish additional protection from the elements. Mounted within the solar panel are a plurality of photovoltaic cells 15 interconnected by contacts 16 and bus bar 17 and outputted through electrical conduit 28 in a manner well known to those skilled in this art. The bottom 13 of the solar panel that is a part of the present invention is formed from a heat conductive metal or a heat conductive resin, as will be discussed more thoroughly hereafter. If desired, the side and end walls 11 and 12 of the tray that forms the panel 10 may be composed of material that is not heat conductive when compared with material from which the bottom 13 of the solar panel if composed. Thus, such side and end walls 11 and 12 may be formed from an insulating resin, e.g., polyurethane.

Figure 3:
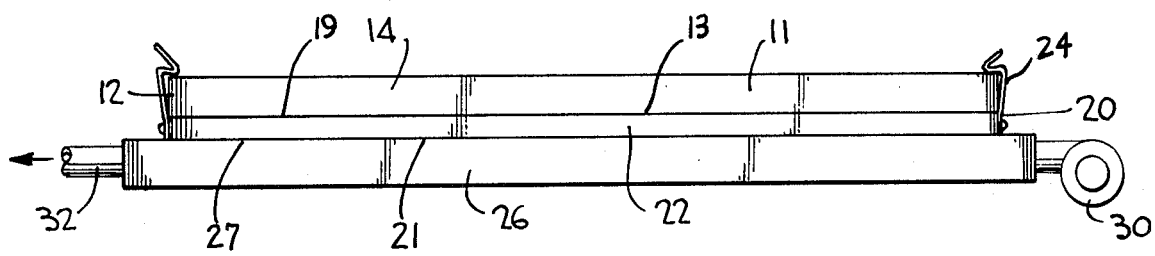
FIG. 3 is a side elevational view of the device of FIGS. 1 and 2.

As shown in this best mode, the phase change material (PCM) is illustrated within a separate container, generally indicated by arrow 18. Phase change material container 18 has a top 19, end walls 20 and a bottom 21. Side walls 22 are best seen in FIG. 3. The phase change material, itself, is indicated in granular form by reference numeral 23. By means of clips 24 or similar simple mechanical devices, the PCM container 18 may be located in close proximity to the solar panel 10.

Figure 2:
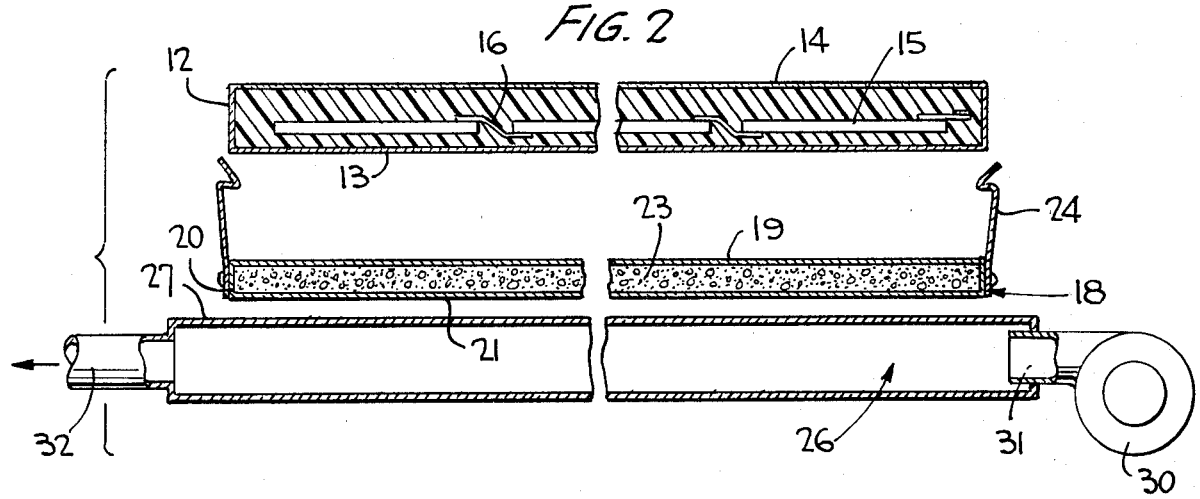
FIG. 2 is an exploded, vertical sectional view of the device of FIG. 1, taken along the line 2—2 thereof.

As best shown in the exploded view of FIG. 2, in this preferred embodiment the third unit of the entire structure may be composed of a duct, referred to generally by reference numeral 26. As so viewed, the duct is shown as a separate entity having a top wall 27 that is formed from heat conductive material, as is the top wall 19 of the container and that container's bottom wall 21. Impeller means 30 is located so as to blow air into connecting orifice 31, through conduit 26 and then through exit passageway 32, although water or some other heat transporting liquid could be utilized for this purpose. The entire combined device lacks great complexity and is therefore adapted for economic and efficient operation.

What are referred to generally as phase change materials are well known to those of skill in the art. While the general term could apply to almost any material that does change its phase, e.g., from solid to liquid to gas, the term as used here refers basically to materials that undergo a change from solid to liquid at a temperature range between approximately 5° C. and 200° C., although according to the specific use for which the phase change materials, conveniently referred to as PCMs, are to be used, broader ranges of melting points could be utilized. To be most useful, phase change materials should have high thermal storage capacity, low weight and low volume per unit of energy storage, at least when compared with rock bed or water storage systems.

While I do not intend that to be strictly limited to any particular class of PCMs, because the specific PCM will be determined largely by its melting point and the climatic and insolation characteristics within which it operates, those which appear to be most readily suitable for use in the present invention are inorganic salt hydrates, due to their low cost and high heats of fusion. To be commercially marketable, PCMs must meet safety and performance standards, have reasonable life expectancies, and be available in sufficient quantities and at a reasonable cost. While not all salt hydrates meet this requirement, many do, the most common being sodium sulfate decahydrate, $Na_2SO_4.10H_2O$. Sodium sulfate decahydrate, commonly known as Glauber's salt, is one of the least expensive and most available chemicals that appear to be suitable for use here as phase change materials. It melts at approximately 90° F. and has a relatively high heat of fusion of 108 BTU/lb. Its relatively low cost is due to the fact that it is produced in large quantities as a by-product of several processes. It can also be obtained from natural sources such as salt lakes and dry deposits.

Other salt hydrates that appear to have use as a PCM in my device are $CaCl_2.6H_2O$, which has a melting point between 84° and 120° F. and a heat of fusion of 90 BTU/lb. As presently contemplated, Glauber's salt is the most preferred phase change material for use in the present invention; however, there are other phase change materials that may have good adaptability, and with a passage of time it is expected that additional materials and combinations of PCMs will be deemed highly significant and perhaps more adaptable to use in the present device. It is not the purpose of the present invention, therefore, to select a specific PCM to the detriment of all others that may now or in the future be found to be superior to Glauber's salt. Of course, many PCMs will generally require a nucleating agent to prevent supercooling and a thickening agent to inhibit stratification, and different PCMs may be used at different seasons of the year.

With respect to the materials from which the bottom wall 13 of solar panel 10 can be formed, as well as the top and bottom walls 19 and 21 of the PCM container 18, and also the top wall 27 of conduit 26, while such walls could be formed from a metal, such as copper, which obviously is a good conductor of heat, metallic containers will generally be more expensive than those made of plastics, since the seams of metal containers will probably have to be joined by welding or soldering, which also may enhance corrosion. Also, problems have been encountered with metal containers where sharp PCM crystals can puncture the seams. Resins can be fabricated by blow molding or other low-cost methods. Containers from such materials as polyethylene, polypropylene, or polyvinylchloride or copolymers of these materials have been successfully used for other heat exchange applications and may be used for the bottom wall 13 of solar panel 10, and the side walls 11 and 12 of that tray as well, if desired, and for the entirety of the PCM container 18 and the conduit 26. In such case, it may be desirable to have the side and end walls of the solar panel made of a relatively non-heat conductive resin, such as a polyurethene resin.

In the selection of materials from which the PCM container 18 is to be formed, attention will have to be paid to the phase change material, itself, that is to be contained or sealed within that container. Thus, if a salt hydrate is to be used as the PCM material, a container should be selected in which the material will have a low permeability to water vapor. In such case, rigid polyvinylchloride will probably not be as useful a material as a high density polyethylene, which has a far lower permeability to water vapor. As the particular substance to be used as the PCM is selected for the specific use contemplated, specific materials used to house the PCM will likewise undergo reanalysis. Consequently, unless that use is known definitely, there can be no selection of a material which, for effectiveness and economy, will prove to be the most adaptive. At this time, however, I contemplate that the use of high density polyethylene will be most suitable to contain sodium sulfate decahydrate, due to the low permeability of the former to the passage of water vapor therethrough.

A device according to my invention is best seen in assembled form in FIG. 3 of the drawing. It will there be seen that the clasp 24 has been closely positioned to and holds container 18 against the bottom 13 of solar panel 10. In such position it will be apparent that, provided that the retaining means is of sufficient reliability, in order to avoid loss of PCM material and water of hydration, the container 18 may have an open top, i.e., the top 19 of the PCM container may be removed, thereby eliminating another wall through which heat must pass. Alternatively, either the top wall 19 of PCM container 18 or bottom wall 13 of solar panel 10 could have other means to enable heat to pass easily between those two walls. Further, the top wall 27 of conduit 26 might also be eliminated so that the bottom wall 21 of PCM container 18 serves both as such bottom wall and forms the top of the conduit 26.

As assembled, during daylight use electricity generated by exposure of the photovoltaic cells 15 to sunlight will pass from cell to cell by means of connectors 16 and bus bar 17 and is outputted in the usual manner by conduit 28. Heat generated during the photovoltaic process, and particularly by the exposure of the cells to full sunlight, will be concentrated within the solar panel 10 by the glass facing 14 and passed to the bottom wall 13 of the panel and thence by conduction or otherwise through that wall and the top wall 19 of the PCM container 18. Sufficient quantities of heat will melt the phase change material 23 within container 18, thereby absorbing large quantities of heat and removing them from the immediate vicinity of the photovoltaic cells 15. When it is desired to utilize that heat, impeller 30 forces cold air through duct 31 into conduit 26, where the top wall 27 is in close, heat transfer relationship to bottom wall 21 of container 18. Consequently, there will be a continuous flow of heat as the phase change material gradually melts and gives off its heat of fusion.

Thus, in a relatively small space, relatively large quantities of heat, which would otherwise not be stored or utilized in any way but would act to the detriment of the electrical operation of the solar panel, can be utilized to improve the efficiency of the photovoltaic cells of the panel and, concurrently or at a later time, can be used for their latent heat energy by a relatively simple device. Further, as long as any of the PCM is in its lower temperature state, e.g., the inorganic salt hydrate is solid, there will exist a temperature differential whenever the temperature exiting from the solar panel is higher than the melting point of the PCM. Such temperature differential will also be present, of course, when the PCM, in its higher temperature state, e.g., a liquid salt hydrate, is nevertheless at a temperature less than that exiting from the panel. Thus, regardless of air movement and without any moving parts, there will be a continuous transfer of heat from the solar panel to the PCM to improve the efficiency of the panel cells and provide a storage means of heat energy for later use.

It will be apparent that certain modifications and alterations will be found obvious by those of skill in this art with respect to the device illustrated in the drawing and described hereinbefore in conjunction with the best mode of my invention. As to all such alterations and modifications, it is desired that they be included within the purview of my invention, which is to be limited only by the scope, including equivalents, of the terms of the following, appended claims.

I claim:

1. A photovoltaic device for transforming light energy into usable electrical energy and heat energy, comprising
    (a) a solar panel having a bottom and side walls forming a tray with an open front to receive light;
    (b) photovoltaic cells positioned in said tray beneath said open front, said cells having light-receiving, upwardly facing surfaces and electrical contacts for collecting and channeling electrical energy generated by said cells to perform work, said bottom of said tray being formed of material that allows heat to pass through it so that heat also generated during operation of said cells passes to and through said tray bottom, and
    (c) a container housing salt hydrate materials that are solid at ambient temperatures of use of said solar panel and can be melted by the heat generated during operation of said photovoltaic cells, said container being releasably positioned in proximity to said tray bottom, so that heat generated during the operation of said photovoltaic cells will pass to and through said bottom and melt said salt hydrate materials, thereby effectively storing heat in said materials and lowering the operating temperature of said photovoltaic cells.

2. A photovoltaic device as claimed in claim 1, in which said tray bottom is formed from a heat conductive metal.

3. A photovoltaic device as claimed in claim 2, in which said side walls of said tray are formed from material that is less heat conductive than the material from which said bottom is formed.

4. A photovoltaic device as claimed in claim 1, in which said container is itself in the form of a tray having an open top, side walls and a bottom, said open top being positioned closely adjacent to said panel tray bottom and said container side walls abutting said panel.

5. A photovoltaic device as claimed in claim 1, in which said container has a top wall positioned in contiguous contact with said panel tray bottom.

6. A photovoltaic device as claimed in claim 1, in which said container has side walls and a bottom, and said device further includes means for distributing heat from said container to locations remote therefrom.

7. A photovoltaic device as claimed in claim 6, further in which means for distributing heat comprises a duct, one portion of which is formed by said salt hydrate material container bottom.

8. A photovoltaic device as claimed in claim 7, in which said container bottom is formed from heat conductive material and in which said means for distributing heat further includes an impeller for passing fluid in said duct into and out of contact with said container bottom.

9. A photovoltaic device as claimed in claim 1, in which said salt hydrate material comprises sodium sulfate decahydrate.

* * * * *